United States Patent [19]
Miyakoshi et al.

[11] Patent Number: 4,939,106
[45] Date of Patent: Jul. 3, 1990

[54] SINTERED CERAMIC BODY

[75] Inventors: Toshinobu Miyakoshi, Funabashi; Atsushi Yamada, Kawasaki; Akio Koyama, Chiba; Hideaki Ninomiya, Tokyo, all of Japan

[73] Assignee: TDK Corporation, Tokyo, Japan

[21] Appl. No.: 237,158

[22] Filed: Aug. 26, 1988

[30] Foreign Application Priority Data

Aug. 31, 1987 [JP] Japan .................. 62-215242

[51] Int. Cl.$^5$ .................. C03C 1/00; C04B 35/10
[52] U.S. Cl. .................. 501/32; 501/128
[58] Field of Search .................. 501/32, 128

[56] References Cited
U.S. PATENT DOCUMENTS
4,650,923 3/1987 Nishigaki et al. .................. 501/77

OTHER PUBLICATIONS
Volf, *Chemical Approach to Glass*, 1984, pp. 269–271.

*Primary Examiner*—Mark L. Bell
*Assistant Examiner*—Deborah Jones
*Attorney, Agent, or Firm*—Wyatt, Gerber, Burke & Badie

[57] ABSTRACT

High-quality ceramic bodies suitable for use as a substrate of electronic devices can be prepared by sintering, at an outstandingly low temperature of 1000° C. or below, a binary powder mixture composed of 30–50% by weight of a non-glassy phase of aluminum oxide and 70–50% by weight of a glassy phase having a quaternary composition composed of silicon dioxide, boron oxide, aluminum oxide and one or more of alkaline earth metal oxides, of which at least 60% by weight is strontium oxide, each constituent being formulated in a specified weight fraction. The ceramic body is particularly advantageous over conventional ones, along with the high mechanical strengths and low dielectric constant, in respect of the resistance against migration of metals therethrough when the ceramic body is in contact with metal-made parts such as electrodes.

4 Claims, No Drawings

SINTERED CERAMIC BODY

BACKGROUND OF THE INVENTION

The present invention relates to a novel electrically insulating sintered ceramic body suitable as a substrate of, e.g., circuit boards. More particularly, the present invention relates to a novel ceramic body capable of being prepared by a sintering process at an outstandingly low temperature of 1000° C. or below and still suitable as a substrate of electronic circuit boards having high mechanical strengths as well as excellent resistance against migration of a metal when in contact with metal-made parts.

Needless to say, the demand for electrically insulating plates for circuit boards is rapidly growing in recent years as a substrate material of, for example, semiconductor chips along with the progress in the electronic instruments. It is an outstanding trend that the material of these insulating substrates of circuit boards is selected from ceramics such as alumina, forsterite, steatite, cordierite, mullite and the like in view of their high heat resistance and stability. One of the major problems common in these ceramic materials is that the manufacturing process thereof involves a step of sintering which must be performed at an extremely high temperature of 1200° C. or higher. In this regard, an improvement has been proposed that the sintering temperature can be decreased when an alkali metal constituent and plumbeous constituent are contained in the ceramic material to be sintered. The improvement obtained by such a means is not applicable to ceramic materials for electric use in general because of the adverse influences caused thereby on the mechanical strengths and electrical insulation.

Alternatively, ceramic materials for circuit board substrates sinterable at a decreased temperature have been proposed in Japanese Patent No. Kokai 61-278195, which is a composite of inorganic oxide constituents including alumina $Al_2O_3$ and zirconium silicate $ZrSiO_4$ and a glassy constituent composed of inorganic oxies such as silica $SiO_2$, alumina $Al_2O_3$, boron oxide $B_2O_3$, zinc oxide $ZnO$, barium oxide $BaO$, magnesium oxide $MgO$ and calcium oxide $CaO$. An unavoidable defect in the ceramic materials of this type is the relatively low mechanical strengths as a consequence of the difference in the thermal expansion coefficients between the non-glassy sintered phase of the inorganic oxides and the glassy phase in addition to the generally low mechanical strengths of the glassy material.

Several prior art documents disclose similar composite sintered ceramic bodies composed of a glassy phase and a non-glassy or crystalline phase including U.S. Pat. No. 4,650,923 and U.S. Pat. No. 4,490,429, Japanese Patent Nos. Kokai 60-260465, 60-257195 and 62-113758 and Japanese Patent Publications Nos. 59-22399, 60-8229 and 58-28757. The ceramic materials disclosed in these documents, however, have several problems such as a difficulty in controlling the degree of crystallization as a key factor for the mechanical strength and low resistance against migration of metals as well as in the stability at high temperatures due to evaporation loss of some constituents since they contain calcium oxide and/or magnesium oxide as the principal alkaline earth constituents, lead oxide and alkali metal oxides.

SUMMARY OF THE INVENTION

The present invention accordingly has an object to provide a novel sintered ceramic body containing no lead oxide or alkali metal constituents and having a low dielectric constant suitable as a substrate material of circuit boards capable of being produced by a process in which sintering of the material is performed at an outstandingly low temperature of, for example, 1000° C. or below and still excellent in the electrical insulation and mechanical strengths as well as in the resistance against migration of metals therethrough.

The novel sintered ceramic body of the invention developed as a result of the investigations undertaken with the above mentioned object is a sintered body of a composite ceramic material composed of a glassy phase and a non glassy sintered inorganic oxide phase mainly composed of aluminum oxide.

Thus, the insulating ceramic body of the invention is a sintered body of a mixture consisting essentially of:

(A) from 30 to 50% by weight of a non-glassy phase mainly composed of aluminum oxide $Al_2O_3$; and (B) from 70 to 50% by weight of a glassy phase of a composition composed of or consisting essentially of silicon dioxide $SiO_2$, boron oxide $B_2O_3$, aluminum oxide $Al_2O_3$ and an oxide or oxides of alkaline earth metals in a weight ratio of (46–60):(0.5–5):(6–17.5):(25–45), at least 60% by weight of the oxides of alkaline earth metals being strontium oxide SrO.

DETAILED DESCRIPTION OF THE PREFERRED EMBODIMENTS

As is described above, the novel sintered ceramic body of the invention is a composite ceramic body composed of a non-glassy phase of an inorganic oxide, which is mainly aluminum oxide, and a glassy phase composed of several kinds of inorganic oxides. The weight proportion of the non-glassy phase to the glassy phase is in the range from 30:70 to 50:50 or, preferably, in the range from 35:65 to 45:55. When the weight proportion of the glassy phase is too large, the versatility of the manufacturing process relative to the sintering temperature is greatly decreased or the sintering treatment must be performed in a very narrowly limited temperature range. When the weight proportion of the glassy phase is too small, on the other hand, the sintered body would not have a sufficiently high density relative to the true density unless the sintering temperature is increased to substantially exceed 1000° C.

In contrast to the non-glassy phase which is composed mainly of a single constituent of aluminum oxide, the glassy phase of the inventive ceramic body is a quaternary oxide phase composed of the oxides of silicon, boron, aluminum and one or more of alkaline earth metals each in a specified weight proportion. The weight proportions of silicon dioxide, boron oxide, aluminum oxide and alkaline earth oxide or oxides in the glassy phase are in the ranges from 46 to 60%, 0.5 to 5%, 6 to 17.5% and 25 to 45%, respectively, or, preferably, in the ranges from 47 to 55%, 1 to 3%, 7 to 16.5% and 30 to 40%, respectively. When the content of silicon dioxide is too low, a difficulty is encountered in the vitrification of the oxides to form the glassy phase. When the content of silicon dioxide is too high, on the other hand, the melting point of the glassy phase is unduly increased so that the temperature of the sintering treatment must also be increased accordingly. When the content of boron oxide in the glassy phase is too high, the moisture resistance of the sintered body may be decreased to affect the stability of the circuit board while a too small amount of boron oxide is undesirable because the temperatures for the vitrification and sintering must be somewhat increased. When the content of aluminum oxide is too low, the sintered ceramic body may have somewhat decreased mechanical strengths while an excessive increase in the content of aluminum oxide may cause difficulties in the vitrification of the oxide mixture.

The fourth oxide constituent of the glassy phase is an alkaline earth metal oxide or a combination of alkaline earth metal oxides selected from magnesium oxide MgO, calcium oxide CaO, barium oxide BaO and strontium oxide SrO. When the fourth oxide constituent is a single alkaline earth metal oxide, the alkaline earth metal oxide should be strontium oxide. When it is a combination of two kinds or more of the above mentioned alkaline earth metal oxides, at least 60% by weight or, preferably, at least 80% by weight thereof should be strontium oxide. When the content of strontium oxide in the glassy phase is too low, matching is lost in the thermal expansion coefficients between the glassy and non-glassy phases. Namely, the glassy phase may have a thermal expansion coefficient considerably smaller than that of the non-glassy phase of aluminum oxide so that the mechanical strengths of the sintered ceramic body are decreased. In this regard, the contents of calcium oxide, magnesium oxide and barium oxide should not exceed 13% by weight, 4% by weight and 5% by weight, respectively, because of the undue decrease in the thermal expansion coefficient of the glassy phase. Increase in the amount of barium oxide over 5% by weight may cause an increase in the dielectric constant of the resultant sintered ceramic body. It is noted that the glassy phase preferably contains these alkaline earth oxides other than strontium oxide in an amount of at least 1% by weight as the total of these three kinds of alkaline earth metal oxides. When properly formulated, the component forming the glassy phase has a desirable linear thermal expansion coefficient in the range from $6.0 \times 10^{-6}$ to $7.2 \times 10^{-6}$ $°C^{-1}$ which is close to that of the non-glassy phase of aluminum oxide of $6.6 \times 10^{-6}$ $°C^{-1}$.

A typical procedure for the preparation of the inventive sintered ceramic body, for example, in the form of a plate is as follows. Thus, aluminum oxide to form the non-glassy phase and the quaternary glassy material are each finely pulverized to have an average particle diameter not exceeding 10 $\mu$m or, preferably, in the range from 1 to 4 $\mu$m and the powders each in a calculated and weighed amount are blended together with a small volume of water or a suitable organic solvent and, if necessary, a binder to form a slip having an adequate consistency. The slip is then shaped by using a doctor blade, extruder machine and the like into a plate-like form having a thickness of 0.1 to 1.0 mm which is subjected to a sintering treatment at a temperature in the range from 800 to 1000° C. Alternatively, a dry powdery blend of the respective constituents is molded into a plate-like green body by compression and the thus compacted green body is sintered as such. It is of course optional that the green body is provided with an overcoating prior to sintering or various parts of an electrically conductive material, insulating material, thermistor material and the like are embedded or inserted in the green body and bonded thereto by concurrent sintering.

The sintered ceramic body obtained in this manner may have a bending strength of 2400 kgf/cm$^2$ or higher, which is comparable to the bending strength of a ceramic body of sintered alumina. Thus, a great advantage is obtained by the present invention that the above mentioned high-strength ceramic bodies can be obtained at an outstandingly low sintering temperature of 1000° C. or below and are used quite satisfactorily as a material of various kinds of electronic components manufactured industrially.

In the following, the present invention is described in more detail by way of examples.

Preparation of glassy materials 1.

Seven glassy materials Samples No. 1 to No. 7 were prepared each by uniformly blending powdery silicon dioxide SiO$_2$, boron oxide B$_2$O$_3$, aluminum oxide Al$_2$O$_3$, calcium carbonate CaCO$_3$, barium carbonate BaCO$_3$ and strontium carbonate SrCO$_3$ in a weight proportion calculated as oxide shown in Table 1 in a ball mill and heating the blend at 1400° C. or above to melt and vitrify the respective constituents altogether followed by cooling. The linear thermal expansion coefficients of these glassy materials are shown in Table 1. As is noted in this table, the increase n the weight fraction of silicon dioxide has an effect, as a general trend, to decrease the thermal expansion coefficient. For example, Sample No. 7 is less preferable with a decreased thermal expansion coefficient smaller than $6.0 \times 10^{-6}$ $°C^{-1}$.

TABLE 1

| Sample No. | 1 | 2 | 3 | 4 | 5 | 6 | 7 |
|---|---|---|---|---|---|---|---|
| SiO$_2$, % by weight | 46.0 | 47.5 | 51.5 | 54.5 | 56.5 | 59.5 | 60.0 |
| B$_2$O$_3$, % by weight | 1.5 | 1.5 | 1.5 | 1.5 | 1.5 | 1.5 | 3.0 |
| Al$_2$O$_3$, % by weight | 8.5 | 13.0 | 7.0 | 14.0 | 10.0 | 7.0 | 15.0 |
| CaO, % by weight | 1.2 | 1.1 | 1.1 | 0.8 | 0.9 | 0.9 | 1.0 |
| BaO, % by weight | 3.3 | 2.8 | 3.0 | 2.2 | 2.3 | 2.3 | 1.0 |
| SrO, % by weight | 39.5 | 34.1 | 35.9 | 27.0 | 28.8 | 28.8 | 20.0 |
| [SrO]/[CaO + BaO + SrO], % | 89.8 | 89.7 | 89.8 | 90.0 | 90.0 | 90.0 | 90.9 |
| Alkaline earth metal oxides, % by weight | 44.0 | 38.0 | 40.0 | 30.0 | 32.0 | 32.0 | 23.0 |
| Linear thermal expansion coefficient, $\times 10^{-6}$ $°C^{-1}$ | 6.8 | 6.7 | 6.4 | 6.1 | 6.2 | 6.0 | 5.8 |

Preparation of glassy materials 2.

Five glassy materials Samples No. 8 to 12 were prepared each in a similar manner to the procedure described above and the linear thermal expansion coefficients of the glassy materials were determined to give the results shown in Table 2. In the formulation for each sample, the weight fractions of silicon dioxide and boron oxide were 52.5% by weight and 1.5% by weight, respectively, and the weight fractions of the other constituents calculated as oxide were as shown in Table 2. The thermal expansion coefficient of Sample No. 11 was somewhat too small presumably because of the low weight fraction of strontium oxide in the overall content of the alkaline earth metal oxides. The glassy material of Sample No. 12 had brittleness presumably because of the low weight fraction of 5.0% by weight of aluminum oxide. These two glassy materials were less preferable as the glassy phase of the inventive ceramic composition.

TABLE 2

| Sample No. | 8 | 9 | 10 | 11 | 12 |
|---|---|---|---|---|---|
| $Al_2O_3$, % by weight | 11.0 | 11.0 | 11.0 | 11.0 | 5.0 |
| CaO, % by weight | 3.3 | 0 | 1.0 | 14.0 | 1.1 |
| BaO, % by weight | 10.1 | 0 | 2.6 | 1.6 | 4.0 |
| SrO, % by weight | 21.6 | 35.0 | 31.4 | 19.4 | 35.9 |
| [SrO]/[CaO + BaO + SrO], % | 61.7 | 100.0 | 89.7 | 55.4 | 87.6 |
| Alkaline earth metal oxides, % by weight | 35.0 | 35.0 | 35.0 | 35.0 | 41.0 |
| Linear thermal expansion coefficient, $\times 10^{-6} \, °C.^{-1}$ | 6.8 | 6.5 | 6.5 | 5.9 | 6.1 |

Preparation of glassy materials 3.

Six glassy materials Samples No. 13 to No. 18 were prepared and the linear thermal expansion coefficients thereof were determined in substantially the same manner as in the procedure described above to give the results shown in Table 3. The formulation of each preparation was as shown in Table 3.

Samples No. 16 and No. 17 were not vitrified presumably because of the excessively large weight fraction of aluminum oxide over 17.5% by weight and deficiency in the weight fraction of silicon dioxide smaller than 46% by weight, respectively. Further, the glassy material of Sample No. 18 was hygroscopic and had a decreased mechanical strength presumably because of the excessively large weight fraction of boron oxide over 5% by weight so that it could not be used as a component of electrically insulating ceramic materials.

TABLE 3

| Sample No. | 13 | 14 | 15 | 16 | 17 | 18 |
|---|---|---|---|---|---|---|
| $SiO_2$, % by weight | 50.0 | 52.5 | 52.5 | 46.5 | 43.5 | 48.0 |
| $B_2O_3$, % by weight | 4.0 | 1.5 | 1.5 | 1.5 | 1.5 | 6.0 |
| $Al_2O_3$, % by weight | 11.0 | 11.0 | 11.0 | 18.0 | 12.0 | 11.0 |
| CaO, % by weight | 0 | 1.0 | 1.0 | 1.0 | 1.2 | 1.0 |
| BaO, % by weight | 1.0 | 2.6 | 2.6 | 2.6 | 3.2 | 2.6 |
| MgO, % by weight | 0 | 2.0 | 4.0 | 0 | 0 | 0 |
| SrO, % by weight | 34.0 | 29.4 | 27.4 | 30.4 | 38.6 | 31.4 |
| [SrO]/[CaO + BaO + MgO + SrO], % | 97.1 | 84.0 | 78.3 | 89.4 | 89.8 | 89.7 |
| Alkaline earth metal oxides, % by weight | 34.0 | 35.0 | 35.0 | 34.0 | 43.0 | 35.0 |
| Linear thermal expansion coefficient, $\times 10^{-6} \, °C.^{-1}$ | 7.0 | 6.1 | 6.0 | | | 7.2 |

EXAMPLES 1 TO 7 AND COMPARATIVE EXAMPLES 1 TO 6.

The glassy materials obtained in the above described preparation were each crushed and then finely pulverized in a ball mill taking 24 hours. The thus obtained glass powders had an average particle diameter of about 2 μm. A slip was prepared by mixing the glass powder and an aluminum oxide powder having an average particle diameter of about 1.5 μm taken in a weight proportion shown in Table 4 together with a small volume of water and the slip was spread in a plate-like form of 0.5 mm thickness by using a doctor blade followed by drying and subjected to a sintering treatment for 30 minutes at the temperature indicated in Table 4, which also shows the relative densities by sintering, bending strengths and dielectric constants of the thus prepared ceramic plates.

In Table 4, the ceramic plate of Comparative Example 1 had low bending strength presumably due to the smaller proportion of aluminum oxide than 30% by weight while the ceramic plate of Comparative Example 2 containing an excessively large amount of aluminum oxide could be imparted with a sufficiently high bending strength of 2900 kgf/cm² only by increasing the sintering temperature up to 1100° C. The low bending strength of the ceramic plate in Comparative Example 3 was presumably due to the use of the glassy material No. 7 having an unduly low thermal expansion coefficient as a result of the deficiency of the alkaline earth metal oxides in the formulation of the glassy material. The ceramic plate in Comparative Example 4 could be imparted with a satisfactorily high bending strength of 2100 kgf/cm² only by increasing the sintering temperature up to 1150° C. presumably due to the use of the glassy material containing an excessively large amount of aluminum oxide to cause incomplete vitrification. The ceramic plate of Comparative Example 5 had defects of not only the low bending strength but also solubility in hot water. The low bending strength of the ceramic plate in Comparative Example 6 was presumably due to the use of the glassy material of the formulation in which the weight fraction of strontium oxide relative to the overall alkaline earth metal oxides was small.

TABLE 4

| | | Glassy material | | Sintering temperature, °C. | Relative density, % | Bending strength, kgf/cm² | Dielectric constant at 1 MHz |
|---|---|---|---|---|---|---|---|
| | | No. | % by wt. | | | | |
| Example | 1 | 10 | 70 | 850 | 98 | 2500 | 7.1 |
| | 2 | 10 | 60 | 900 | 98 | 2900 | 7.2 |
| | 3 | 10 | 50 | 980 | 95 | 2900 | 7.4 |
| | 4 | 5 | 60 | 900 | 97 | 2600 | 7.2 |
| | 5 | 8 | 60 | 900 | 95 | 2400 | 7.4 |
| | 6 | 9 | 60 | 900 | 98 | 2900 | 7.0 |
| | 7 | 14 | 60 | 850 | 97 | 2500 | 7.4 |
| Comparative Example | 1 | 10 | 75 | 850 | 95 | 1500 | 7.0 |
| | 2 | 10 | 45 | 950 | 81 | 1500 | 7.8 |
| | 3 | 7 | 60 | 950 | 97 | 1600 | 7.4 |
| | 4 | 16 | 60 | 950 | 85 | 1700 | 7.9 |
| | 5 | 18 | 60 | 850 | 97 | 2100 | 7.5 |
| | 6 | 11 | 60 | 950 | 96 | 2000 | 7.7 |

What is claimed is:

1. An electrically insulating ceramic body which is a sintered body of a powdery mixture composed of:
   (A) from 30 to 50% by weight of a non-glassy phase of aluminum oxide $Al_2O_3$; and
   (B) from 70 to 50% by weight of a glassy phase of a vitrified composition consisting essentially of from 46 to 60% by weight of silicon dioxide $SiO_2$, from 0.5 to 5% by weight of boron oxide $B_2O_3$, from 6 to 17.5% by weight of aluminum oxide $Al_2O_3$ and from 25 to 45% by weight of strontium oxide SrO or a combination of alkaline earth metal oxides of which at least 60% by weight is strontium oxide SrO.

2. The electrically insulating ceramic body as claimed in claim 1 wherein the weight fraction of the non-glassy phase is in the range from 35 to 45% by weight and the weight fraction of the glassy phase is in the range from 65 to 55% by weight.

3. The electrically insulating ceramic body as claimed in claim 1 wherein the weight fractions of the silicon dioxide, boron oxide, aluminum oxide and alkaline earth metal oxide in the glassy phase are in the range of from 47 to 55% by weight, from 1 to 3% by weight, from 7 to 16.5% by weight and from 30 to 40% by weight, respectively.

4. The electrically insulating ceramic body as claimed in claim 1 wherein the weight fractions of strontium oxide in the overall amount of the alkaline earth metal oxides is at least 80%.

* * * * *